United States Patent
Haskell

[11] Patent Number: 6,110,818
[45] Date of Patent: Aug. 29, 2000

[54] SEMICONDUCTOR DEVICE WITH GATE ELECTRODES FOR SUB-MICRON APPLICATIONS AND FABRICATION THEREOF

[75] Inventor: Jacob Daniel Haskell, Palo Alto, Calif.

[73] Assignee: Philips Electronics North America Corp., Tarrytown, N.Y.

[21] Appl. No.: 09/115,714

[22] Filed: Jul. 15, 1998

[51] Int. Cl.$^7$ .............................................. H07L 21/8238
[52] U.S. Cl. .................... 438/621; 438/584; 438/585; 438/630
[58] Field of Search ................... 438/584, 585, 438/621, 630

[56] References Cited

U.S. PATENT DOCUMENTS

| | | |
|---|---|---|
| 5,026,657 | 6/1991 | Lee et al. . |
| 5,030,585 | 7/1991 | Gonzalez et al. . |
| 5,057,449 | 10/1991 | Lowrey et al. . |
| 5,091,763 | 2/1992 | Sanchez . |
| 5,173,450 | 12/1992 | Wei . |
| 5,188,976 | 2/1993 | Kume et al. . |
| 5,229,307 | 7/1993 | Vora et al. . |
| 5,329,482 | 7/1994 | Nakajima et al. . |
| 5,332,687 | 7/1994 | Kuroda . |
| 5,341,014 | 8/1994 | Fujii et al. . |
| 5,369,055 | 11/1994 | Chung . |
| 5,389,558 | 2/1995 | Suwanai et al. . |
| 5,504,029 | 4/1996 | Murata et al. . |
| 5,612,241 | 3/1997 | Arima . |
| 5,652,464 | 7/1997 | Liao et al. . |
| 5,668,035 | 9/1997 | Fang et al. . |
| 5,670,397 | 9/1997 | Chang et al. .............................. 437/34 |

OTHER PUBLICATIONS

M. Segawa, T. Yabu, M. Arai, M. Moriwaki, H. Umimoto, M. Sekiguchi, and A. Kanda. A 0.18μm Ti–Salicided p–MOSFET with Shallow Junctions Fabricated by Rapid Thermal Processing in an NH$_3$ Ambient, Semicondutor Research Center, Matsushita Electric Industrial Co., Ltd. Moriguchi, Osaka 570 Japan. IEDM 96–443.

*Primary Examiner*—Charles Bowers
*Assistant Examiner*—Lisa Kilday
*Attorney, Agent, or Firm*—Crawford PLLC

[57] ABSTRACT

According to one aspect of the invention, a method of fabricating N+ and P+ silicided gates limits diffusion when using a Tungsten, Titanium or Cobalt silicide in the gate fabrication. An example method involves doping a polysilicon structure in first and second dual gate regions and on either side of an undoped polysilicon region, forming a silicide is over the polysilicon structure, and then stuffing the undoped polysilicon region with a species selected to inhibit lateral diffusion of dopant from the polysilicon in the silicide. Subsequently, each gate is completed so that is includes a dielectric layer arranged over the silicide and one of the doped gate poly regions. Applications include logic circuits having embedded-DRAM, and circuits directed to stand-alone logic or stand-alone DRAM.

18 Claims, 3 Drawing Sheets

SEMICONDUCTOR DEVICE WITH GATE ELECTRODES FOR SUB-MICRON APPLICATIONS AND FABRICATION THEREOF

FIELD OF THE INVENTION

The present invention relates generally to semiconductor devices and their fabrication and, more particularly, to semiconductor devices and their manufacture involving gate electrodes, for example, as may be used in both logic and DRAM (dynamic random access memory) applications.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions.

One important step in the manufacture of such devices is the formation of isolation areas to electrically separate electrical devices, or portions thereof, that are closely integrated in the silicon wafer. While the particular structure of a given active device can vary between device types, a MOS-type transistor generally includes source and drain regions and a gate electrode that modulates current flowing in a channel between the source and drain regions. Current should not flow between source and drain regions of adjacent MOS-type transistors. However, during the manufacturing process movement of dopant atoms, for example, of boron, phosphorus, arsenic or antimony, can occur within the solid silicon of the wafer. This movement is referred to as diffusion. The diffusion process occurs at elevated temperatures where there is a concentration gradient between dopant atoms external to the silicon wafer and dopant atoms diffusing into the silicon wafer and is typical in connection with forming p-type and n-type regions of a silicon integrated circuit device.

A technique referred to as "trench isolation" has been used to limit such flow in the silicon. A particular type of trench isolation is referred to as shallow trench isolation (STI). In typical logic applications involving 0.25 micron CMOS technology, STI is used to separate the respective diffusion regions of devices of the adjacent complementary transistors.

For some CMOS logic applications where scaling of the transistor gates is required, gate electrodes are used in connection with a dual-gate process instead of all n+ poly-type gate electrodes, and source/drain regions are salicided using Titanium with gate oxides (dielectrics) being relatively thin (for example, about 45 Å). One such application can involve applying five layers of metal interconnect, with use of Tungsten plugs and chemical mechanical polishing (CMP). A relatively high annealing temperature would typically be used to activate dopants in the polysilicon, while a lower annealing temperature would be used for other aspects of the fabrication including saliciding using Ti and preventing shifts in the threshold voltages $V_T$ of the transistors. A practicable fabrication, however, requires use of as few of these high-temperature processes as possible. Thus, in the above-discussed CMOS logic application, tradeoffs are typically made to address such competing concerns.

In contrast to the above type of logic application, many DRAM applications are more concerned with achieving very high yields, very low leakage junctions in the capacitors, and a relatively thick gate oxide (dielectric) to improve reliability for use with higher gate voltage (Vg) requirements, such as in the case of voltage-boosted word lines connected to the gates. DRAM applications are less concerned with transistor gain and, unlike the logic applications, DRAMs employ a complex, small capacitor that is constructed using a self-aligned contact (SAC).

High performance logic circuitry employs high-gain minimum-length transistors, many levels of interconnects and flatter surfaces to aid photolithography in fabricating the interconnects. Specifications for such logic circuitry require high performance, such as reduced RC (resistance-capacitance) delays realized by using salicide processes, and thick interlevel dielectric layers. Somewhat higher levels of leakage ensuing from salicide processes are tolerated. SACs are rarely used. To continue to scale the transistors in a downward direction, dual gate technology is used with both n-type and p-type devices being surface channel type.

Practicably combining logic circuits with DRAMs in the same integrated circuit, sometimes referred to as embedded DRAM applications, requires a melding of competing processing approaches for logic circuits and DRAM circuits. For instance, DRAM cells are typically all n-channel transistor and are not implemented using surface-type transistor channels.

Embedded DRAMs and other stand-alone circuit applications employ, or would benefit from employing, silicided (N+ or P+) gate electrodes. It is difficult, however, to manufacture silicided gate electrodes without undesirable levels of lateral diffusion of the dopants in the silicide formed over the gates. Too much lateral diffusion results in counter doping, thereby resulting in deficient operation of the transistor. This diffusion problem is prevalent in Tungsten-silicided gate electrodes, but can occur in all silicided gates.

With the demands for increasing the density of such MOS-based circuits continuing to escalate, there is an ongoing need to reduce the amount of real estate consumed by various aspects of the circuits and to minimize the complexities and deficiencies resulting from manufacturing processes.

SUMMARY OF THE INVENTION

The present invention is exemplified in a number of implementations and applications, some of which are summarized below. According to one embodiment, N+ and P+ silicided gates are defined separately prior to any high temperature process where diffusion occurs. In a more particular implementation, a Tungsten or Titanium silicide gate is fabricated in a logic/DRAM process with logic that uses PMOS with P+ poly.

In another embodiment of the present invention, a method of forming a polysilicon gate structure includes providing a polysilicon structure with doped regions of opposite polarity, the regions being laterally located on either side of an undoped polysilicon region. A silicide is formed over the polysilicon structure, and, over the undoped polysilicon region, the silicide is stuffed between these regions (for example, using an ion-implant) with material, such as Si, $O_2$ or $N_2$, for inhibiting lateral diffusion in the silicide. A dielectric is then formed over the silicide, and the structure is mask-etched to form a polysilicon gate including the dielectric layer arranged over the silicide and including one of the doped regions of opposite polarity.

In yet other embodiments of the present invention, a method of fabricating an integrated circuit, comprises the steps of: providing a polysilicon structure with an N+ region and a P+ region, the N+ region and the P+ region being laterally located on either side of an undoped polysilicon region; forming a silicide using Tungsten, Titanium or Cobalt over the polysilicon structure; masking the silicide over the N+ and P+ poly regions and stuffing, over the undoped polysilicon region, the silicide with material for inhibiting lateral diffusion of the N+ or P+ dopants in the silicide; forming a dielectric over the silicide; and mask-etching to form a first poly gate including the dielectric, the Tungsten (or Titanium) silicide and the N+ region, and a second poly gate including the dielectric, Tungsten (or Titanium) silicide and the P+ region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
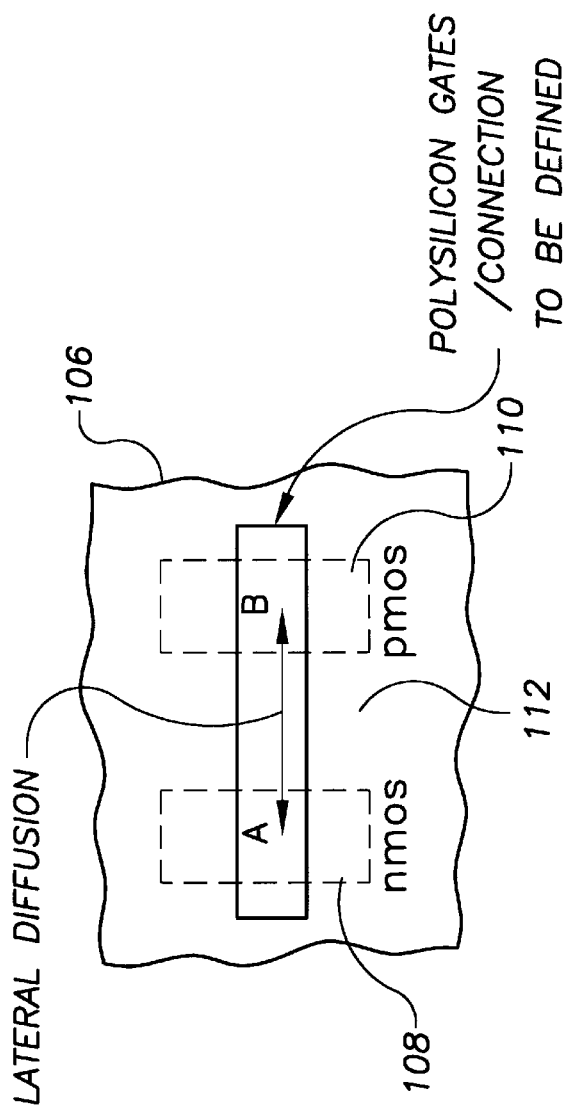
FIGS. 1 and 2 respectively show a top view of an integrated circuit structure and the corresponding cross-sectional view, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF VARIOUS EMBODIMENTS

The present invention has been found to be advantageous in applications where it is desirable to limit diffusion in connection with the fabrication of N+ and P+ silicided gates. The present invention has been found to be particularly advantageous when using a Tungsten, Titanium or Cobalt silicide in the gate fabrication. Such applications include, for example, logic circuits having embedded-DRAM, stand-alone logic applications and stand-alone DRAM applications. While the present invention is not necessarily limited to these environments, an appreciation of various aspects of the invention is best gained through a discussion of one or more example processes used to form such semiconductor devices.

Consistent with the present invention, a first example embodiment is directed to a method of forming a polysilicon gate structure as part of the fabrication of a semiconductor device. The method involves doping a polysilicon structure in first and second regions so that each region is of opposite polarity. The regions are laterally located on either side of an undoped polysilicon region. A silicide is formed over the polysilicon structure, and then the undoped polysilicon region is ion implanted with a species selected to inhibit lateral diffusion of dopant from the polysilicon in the silicide. The species used for the ion implant can be, for example, Si, $O_2$ or $N_2$. Next, a dielectric is formed over the silicide, and the entire structure is then selectively masked and then etched to form first and second polysilicon gates, each gate including the dielectric layer arranged over the silicide and including one of the doped regions of opposite polarity.

The process of fabricating the semiconductor device can continue for the given application, with conventional high-temperature processes being implemented after formation of the P+ and N+ gates. In one particular example implementation, after etching to form polysilicon gate structures, the structure edges are lightly oxidized to form oxide on either side of the structures, and source and drain regions are formed using graded doping techniques. Such conventional processing used to complete the fabrication typically involves high temperature processes such as annealing. By previously forming the P+ and N+ gates, the number of high temperature processes, and therefore the risk of causing unacceptable levels diffusion in the silicide, is minimized. For further information concerning conventional processing approaches, reference may be made to any of a number of existing U.S. Patents including, for example, U.S. Pat. No. 5,229,307 (Vora et al.), U.S. Pat. No. 5,329,482 (Nakajima et al.), U.S. Pat. No. 5,091,763 (Sanchez), and U.S. Pat. No. 5,631,182 (Suwani et al.).

Stuffing the undoped polysilicon region to inhibit lateral diffusion of dopant from the polysilicon in the silicide is advantageous. In many conventional applications, doping of the gate electrodes is done at the same time as doping of the substrate to form source and drain regions. This conventional practice presents a significant risk that the gate regions can become counter doped with the subsequent silicide formation, and this likelihood is increased when the silicided N+ and P+ gates are formed using Tungsten, Titanium or Cobalt silicide. By forming the silicided N+ and P+ gates before forming the source and drain regions, this counter-doping problem is avoided because the doping concentrations for the gate can be much lower than that required for the source and drain regions (for example, three-times to five-time less).

The above-described processes are particularly desirable for applications where circuitry that uses PMOS with P+ polysilicon is combined with circuitry that is fabricated using a process already set up to form Tungsten, Titanium or Cobalt silicide gates. For example, embedded DRAM circuits typically involve the combination of logic circuitry (that uses PMOS with P+ polysilicon) with DRAM fabrication processes where Tungsten silicide gates are commonly used and are susceptible to severe lateral diffusion in the silicide.

Figure 2:
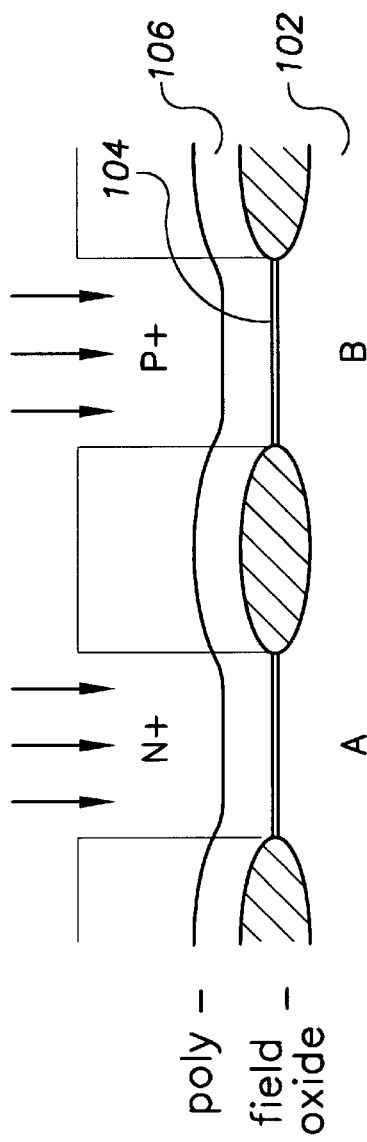
Figure 3:
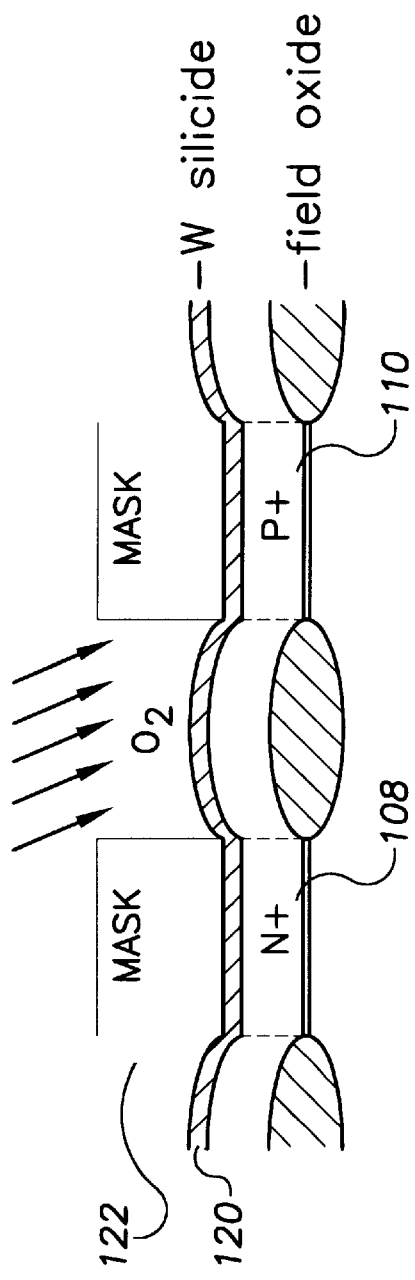
FIGS. 3 and 4 illustrate the integrated circuit structure of FIGS. 1 and 2 at later stages of processing, also in accordance with the same example embodiment of the present invention.
Figure 4:
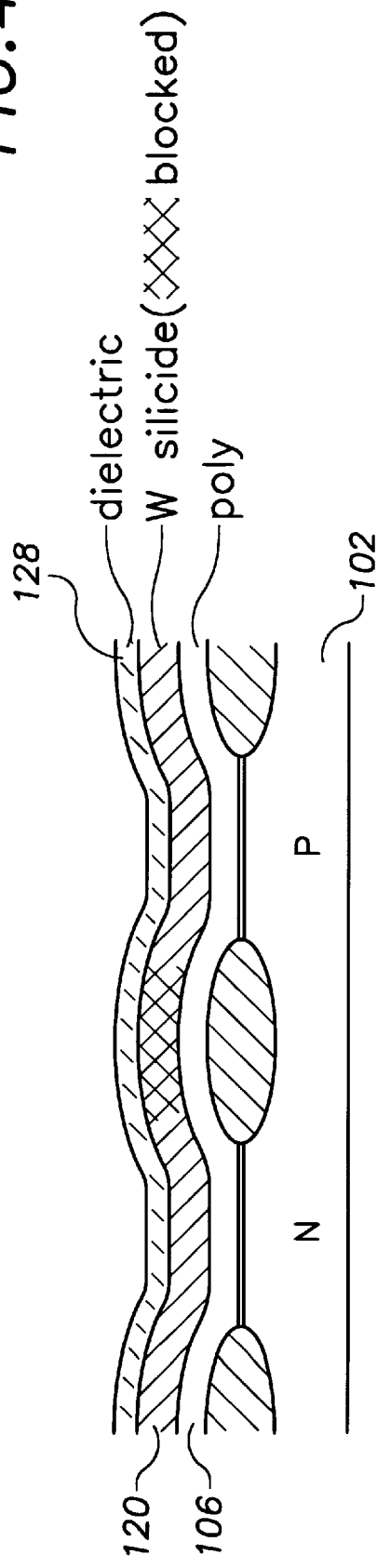
Figure 5:
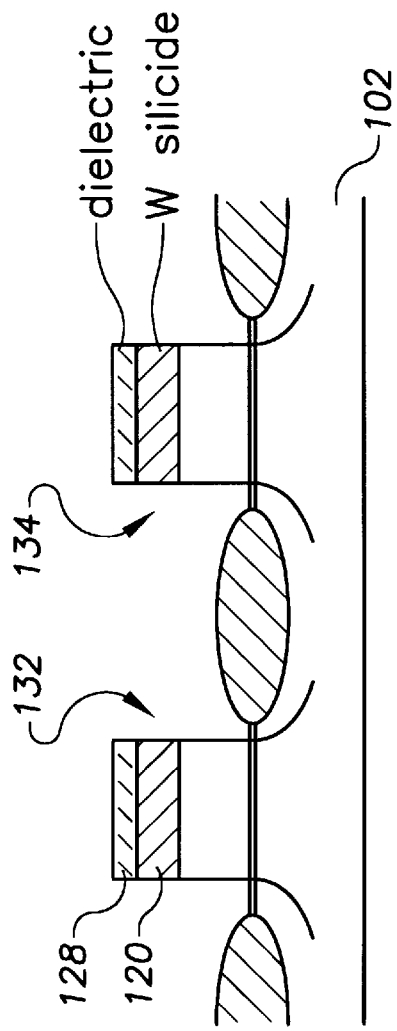
FIG. 5 illustrates another cross-sectional view (turned ninety degrees) at a later stage of processing in which dual gates are formed, using the same example embodiment.

Turning now to the drawings, FIGS. 1 and 2 respectively depict top and cross-sectional views of an integrated circuit structure in which DRAM circuitry is embedded in logic circuitry processed using P+ polysilcon for the PMOS devices. FIGS. 3–5 illustrate the integrated circuit structure of FIGS. 1 and 2 at later stages of processing, according to a particular example processing method of the present invention.

The method is used to fabricate a specific integrated structure, as follows. A silicon substrate 102 is provided suitable as a building block for the overall structure. A layer of gate oxide 104 is formed over a planar top surface of the silicon substrate 102, and polysilicon is deposited to form the next layer 106.

The N+ and P+ gate areas are then processed. A first mask is used to implant a N+ region 108 (FIGS. 1 and 3), followed by a second mask used to implant a P+ region 110. A photoresist, which used for masking, is stripped after the formation of each of the N+ and P+ regions. As shown in the figures, the N+ and P+ regions are laterally located on either side of an undoped polysilicon region 112 (FIG. 1).

As shown in FIG. 3, Tungsten Silicide, Titanium or Cobalt is then sputtered, or otherwise applied to the structure. After sputtering the Titanium or Cobalt, the structure is then thermally reacted (e.g., using rapid thermal processing (RTP) or annealing (RTA)) at about 650–700° C. with the polysilicon to form a silicide layer 120 over the structure. When using Tungsten silicide, thermal reaction is unnecessary. A mask 122 is applied over the silicide layer, and the mask 122 is opened up (e.g., using an etchant) so that the mask 122 covers only the silicide over the N+ and P+ regions 108 and 110. The region of the silicide over the undoped polysilicon region is ion implanted with a blocking species (e.g., with Si, $O_2$, and $N_2$) to inhibit lateral diffusion of dopant from the polysilicon in the silicide. In the case of Titanium or Cobalt, a subsequent higher temperature RTA (e.g., 850° C.) is done to reduce the silicide sheet resistance, and the blocking species reduces the counter diffusion.

A dielectric layer 128 is then formed over the silicide (FIG. 4), and a conventional mask-etching process is used to form a pair of polysilicon gates 132 and 134.

As shown in the turned (ninety degrees) view of FIG. 5, each gate includes the dielectric 128, the silicide 120 and a layer corresponding to either the N+ region 108 or the P+ region 110.

In connection with the above-described process, the choice of silicide type (e.g., Tungsten, Titanium or Cobalt) can turn on a number of factors. Among many possible factors are the type of fabrication process currently being implemented, certain desired performance-related results, and practicability to implement a certain fabrication process given at least partial fabrication specifications. The particular process and type of silicide chosen impacts the general process, as described above. For example, when using the above-described approach with a Titanium silicide (TiSi2), the ion implant of the species (e.g., Si, $O_2$, and $N_2$) requires less energy than when using the same general process with a Tungsten silicide. Less energy is required because Titanium silicide is usually much thinner than Tungsten silicide.

Figure 6:
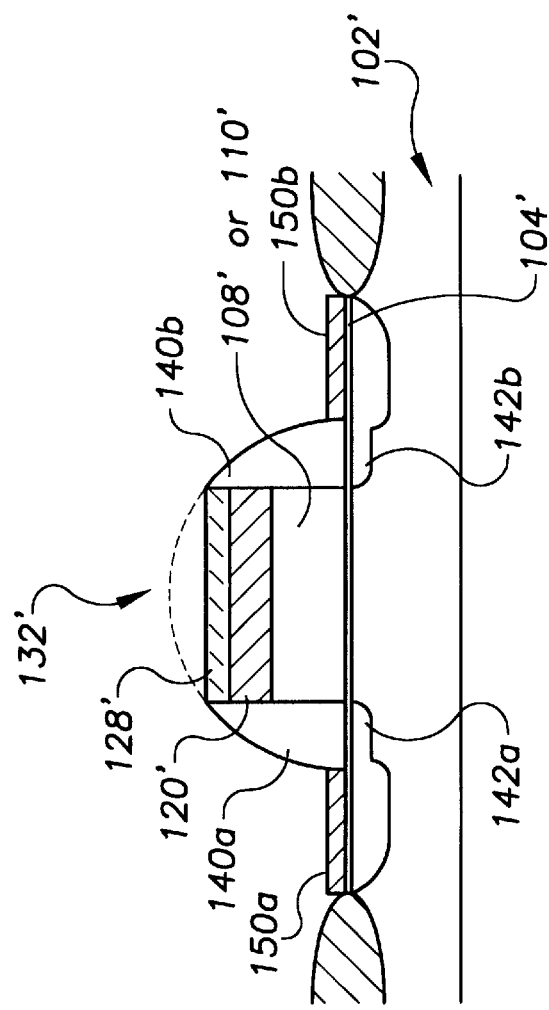
FIG. 6 is a cross-sectional view of an alternative example embodiment, also according to the present invention.

FIG. 6 illustrates another integrated circuit structure manufactured as described above, using a Titanium silicide. The structure includes a gate 132' comprising the doped polysilicon area 108' or 110', a Titanium silicide layer 120', and a dielectric layer 128'. The structure is shown at a later stage than the view of FIG. 5, in that spacers 140a, 140b and source and drain regions 142a, 142b have been formed. The dashed line over the top of the gate dielectric layer 128' represents the etched-back oxidation layer used in forming the spacers 140a, 140b. Oxidizing the edges of the gate 132' and the exposed polysilicon areas, and/or subsequent high temperature processes, drives the N+ and P+ implants into the poly.

Further, the structure of FIG. 6 includes a second Titanium silicide layer 150a, 150b that is formed by thermally reacting the underlying polysilicon with a sputtered Titanium layer. This second Titanium silicide layer 150a, 150b can be independently optimized for the source/drain junctions with respect to the gates and for leakage specifications, for example, using conventional LDD processes.

According to a specific methodology consistent with the present invention, the junctions are selectively scaled in depth so that the second Titanium silicide layer 150a, 150b can be reduced to a desired thickness. In a more particular embodiment of the present invention, the sputtered Titanium is reacted by RTA at about 650–700° C., the stuffed species is Oxygen applied at an energy level of 5E16–2E16 (1E16), and the dielectric layer is deposited using TEOS at about 700° C. or PECVD [nitride, oxide or sion] at about 400–500° C.

This methodology, providing for independent doping and siliciding of the source/drain electrodes, can also be applied when using Tungsten silicide layers or Colbalt silicide layers, rather than the Titanium silicide layers.

The process discussed in connection with FIG. 6 is advantageous when used in connection with a CMOS application. The process uses separate applications of the silicide for the gate and source/drain areas, thereby allowing separate optimization of the silicide over the shallow source/drain junctions. Further, the doping of the polysilicon in the gate area is independent of the doping in the source/drain areas. As discussed, this minimizes diffusion when subjecting the structure to high-temperature processes.

A further significant advantage of doping the polysilicon gate independently from the source and drain regions is that the approach provides for blocking of the BF2 implant that is typically used to obtain shallow P+ source and drain junctions from entering the polysilicon gate. The presence of the Fluorine from the BF2 implant in the polysilicon gate causes enhanced diffusion and penetration of the gate oxide and of the immediately-adjacent silicon channel area by Boron. The above-mentioned processing approach separates the interdependence and permits isolation, e.g., appropriate blocking of the gate by the dielectric over the silicide or the combined dielectric plus the silicide. Also, the prior gate doping can be done with $B_{11}$ (rather than $BF_2$) before implanting with $BF_2$ to obtain the shallow P+ source and drain junctions, thereby minimizing the enhanced diffusion and the undesirable penetration by the Boron.

While the present invention has been described with reference to several particular example embodiments, those skilled in the art will recognize that many changes may be made thereto without departing from the spirit and scope of the present invention, which is set forth in the following claims.

What is claimed is:

1. A method of forming a polysilicon gate structure, comprising the steps of:

providing a polysilicon structure with doped regions of opposite polarity, the regions being laterally located on either side of an undoped polysilicon region;

providing a silicide over the polysilicon structure;

stuffing, over the undoped polysilicon region, the silicide with a species selected to inhibit lateral diffusion of dopant from the polysilicon in the silicide;

forming a dielectric over the silicide; and mask-etching to form a polysilicon gate including the dielectric layer arranged over the silicide and including one of the doped regions of opposite polarity.

2. A method of fabricating an integrated circuit, as recited in claim 1, wherein the species is selected from the following: Si, $O_2$, and $N_2$.

3. A method of fabricating an integrated circuit, as recited in claim 1, wherein forming a silicide includes forming one of the following over the polysilicon structure:
Tungsten silicide, Titanium silicide and Cobalt silicide.

4. A method of fabricating an integrated circuit, as recited in claim 1, wherein the species includes means for inhibiting lateral diffusion of dopant from the polysilicon in the silicide.

5. A method of fabricating an integrated circuit, as recited in claim 1, further including forming doped source and drain regions in the polysilicon structure after mask-etching to form the polysilicon gate.

6. A method of fabricating an integrated circuit, as recited in claim 1, further including providing, separately from the above-recited providing silicide over the polysilicon structure, a silicide for and over the source and drain regions.

7. A method of fabricating an integrated circuit, as recited in claim 1, further including forming doped source and drain regions in the polysilicon structure after mask-etching to form the polysilicon gate, and forming a silicide layer for the source and drain regions.

8. A method of fabricating an integrated circuit, comprising the steps of:

providing a polysilicon structure with an N+ region and a P+ region, the N+ region and the P+ region being laterally located on either side of an undoped polysilicon region;

forming a silicide over the polysilicon structure, the silicide being one of the following types: Tungsten silicide, Titanium silicide and Cobalt silicide;

masking the silicide over the N+ and P+ regions and stuffing, over the undoped polysilicon region, the silicide with means for inhibiting lateral diffusion of dopant from the polysilicon in the silicide;

forming a dielectric over the silicide; and mask-etching to form a first poly gate including the dielectric, the silicide and the N+ region, and a second poly gate including the dielectric, the silicide and the P+ region.

9. A method of fabricating an integrated circuit, as recited in claim 8, further including forming doped source and drain regions in the polysilicon structure after mask-etching to form the first poly gate.

10. A method of fabricating an integrated circuit, as recited in claim 8, wherein the means for inhibiting lateral diffusion of dopant from the polysilicon in the silicide includes at least one of: Si, $O_2$, and $N_2$.

11. A method of fabricating an integrated circuit, as recited in claim 8, further including forming spacers along edges of the first and second poly gates.

12. A method of fabricating an integrated circuit, as recited in claim 11, further including forming a separate silicide layer adjacent to the first and second poly gates for source and drain regions.

13. A method of fabricating an integrated circuit, as recited in claim 8, further including doping the polysilicon gates independently from subsequently formed source and drain regions.

14. A method of forming a polysilicon gate structure, comprising the steps of:

providing a polysilicon structure with doped regions of opposite polarity, the regions being laterally located on either side of an undoped polysilicon region;

providing a silicide over the polysilicon structure;

stuffing, over the undoped polysilicon region, the silicide with a species selected to inhibit lateral diffusion of dopant from the polysilicon in the silicide.

15. A method according to claim 14, further including: forming a dielectric over the silicide.

16. A method according to claim 15, further including: forming a polysilicon gate including the dielectric layer arranged over the silicide.

17. A method according to claim 16, wherein forming the polysilicon gate includes etching a portion of the dielectric layer adjacent a target polysilicon gate region.

18. A method according to claim 17, wherein etching includes mask etching.

* * * * *

UNITED STATES PATENT AND TRADEMARK OFFICE
CERTIFICATE OF CORRECTION

PATENT NO. : 6,110,818  
DATED : August 29, 2000  
INVENTOR(S) : Haskell

Page 1 of 1

It is certified that error appears in the above-identified patent and that said Letters Patent is hereby corrected as shown below:

Title page,
ABSTRACT, line 7, please delete "is" and line 10, please delete "so that is includes" and insert -- with --.

Signed and Sealed this

Seventh Day of May, 2002

Attest:

JAMES E. ROGAN
*Attesting Officer*  *Director of the United States Patent and Trademark Office*